United States Patent
Park et al.

(10) Patent No.: US 8,467,024 B2
(45) Date of Patent: Jun. 18, 2013

(54) LIQUID CRYSTAL DISPLAY PANEL AND FABRICATING METHOD OF THE SAME

(75) Inventors: Won-Sang Park, Yongin (KR); Dong-Hun Lim, Yongin (KR); Min-Woo Kim, Yongin (KR); Il-Nam Kim, Yongin (KR); Jae-Kyoung Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 23 days.

(21) Appl. No.: 13/172,782

(22) Filed: Jun. 29, 2011

(65) Prior Publication Data

US 2012/0008060 A1  Jan. 12, 2012

(30) Foreign Application Priority Data

Jul. 6, 2010  (KR) .................. 10-2010-0064920

(51) Int. Cl.
  *G02F 1/1343*  (2006.01)
(52) U.S. Cl.
  USPC ............................ 349/139; 349/142; 349/143
(58) Field of Classification Search
  USPC .................................. 349/139, 142, 143
  See application file for complete search history.

(56) References Cited

FOREIGN PATENT DOCUMENTS

| | | |
|---|---|---|
| JP | 2003-107508 | 4/2003 |
| KR | 10-2001-0005224 A | 1/2001 |
| KR | 10-2001-0027685 A | 4/2001 |
| KR | 10-2007-0112955 A | 11/2007 |

*Primary Examiner* — Phu Vu
(74) *Attorney, Agent, or Firm* — Christie, Parker & Hale, LLP

(57) ABSTRACT

A liquid crystal display panel is capable of implementing high resolution without reducing an aperture ratio. A liquid crystal display panel includes: a substrate; a sustain electrode at a pixel region on the substrate; opaque wires positioned around the pixel region, having a lattice form extending in a first direction and a second direction crossing the first direction, and coupled with the sustain electrode; a gate wire and a data wire insulated from the gate wire with a second insulating layer interposed therebetween and extending in the second direction; a thin film transistor coupled with the gate wire and the data wire; and a pixel electrode coupled with the thin film transistor. The sustain electrode includes a transparent conductive material, and the opaque wires includes a conductive material having an electrical resistance lower than that of the transparent conductive material.

21 Claims, 12 Drawing Sheets

LIQUID CRYSTAL DISPLAY PANEL AND FABRICATING METHOD OF THE SAME

CROSS-REFERENCE TO RELATED APPLICATION

This application claims priority to and the benefit of Korean Patent Application No. 10-2010-0064920 filed in the Korean Intellectual Property Office on Jul. 6, 2010, the entire content of which is incorporated herein by reference.

BACKGROUND

1. Field

Aspects of embodiments according to the present invention are directed toward a liquid crystal display panel, and more particularly, a liquid crystal display panel capable of implementing high resolution and a fabricating method of the same.

2. Description of the Related Art

A liquid crystal display (LCD) is widely used for small sized products such as a cellular phone, a personal digital assistant (PDA), and a portable multimedia player (PMP) due to small size, light weight, and lower power consumption.

The liquid crystal display includes a liquid crystal display panel for displaying an image according to pixel data using an optical characteristic of a liquid crystal layer, a printed circuit board with a driving circuit for driving the liquid crystal display panel, a back-light assembly including a light source for displaying a screen, and a mold frame receiving the back-light assembly. Among them, the liquid crystal display panel includes an array substrate with thin film transistors (TFTs), a color filter substrate with a color filter (CF), and a liquid crystal layer interposed therebetween, and displays images by driving and controlling the liquid crystal layer on the basis of an electric field difference between the array substrate and the color filter substrate.

Here, a size of one pixel is small in order to manufacture a liquid crystal display having a high resolution. In general, a hole is formed in a layer on the thin film transistor in the array substrate, and the thin film transistor is coupled with a pixel electrode through the hole to form a pixel, but the size reduction of the hole in the pixel is limited. That is, the size of the hole cannot be reduced to the same extent while reducing the size of the pixel in order to implement the high resolution. Therefore, an occupancy ratio of the hole in the pixel increases.

As a result, an aperture ratio of the pixel may decrease, and when the size of the pixel is smaller than a certain level, the hole might be larger than the pixel, such that the pixel cannot be formed.

The above information disclosed in this Background section is only for enhancement of understanding of the background of the invention, and therefore it may contain information that does not form the prior art that is already known in this country to a person of ordinary skill in the art.

SUMMARY

Embodiments of the present invention are directed toward a liquid crystal display panel capable of implementing a high resolution without reducing an aperture ratio.

Further, embodiments of the present invention are directed toward a method of fabricating a liquid crystal display panel capable of controlling liquid crystal molecules in a vertical alignment (VA) mode while implementing a high resolution.

An exemplary embodiment of the present invention provides a liquid crystal display panel that includes: a substrate; a sustain electrode positioned at a pixel region on the substrate; opaque wires positioned around the pixel region, having a lattice form extending in a first direction and a second direction crossing the first direction, and coupled with the sustain electrode; a gate wire insulated from the sustain electrode and the opaque wires with a first insulating layer interposed therebetween and extending in the first direction; a data wire insulated from the gate wire with a second insulating layer interposed therebetween and extending in the second direction; a thin film transistor coupled with the gate wire and the data wire; and a pixel electrode coupled with the thin film transistor. In this embodiment, the sustain electrode includes a transparent conductive material, and the opaque wires include a conductive material having an electrical resistance lower than that of the transparent conductive material.

The opaque wires may have a black color.

The opaque wires may include molybdenum, and the sustain electrode may include indium tin oxide (ITO) or indium zinc oxide (IZO).

At least a part of the sustain electrode and the data wire are not overlapped with each other.

The liquid crystal display panel may further include: a first protrusion pattern covering the thin film transistor; and a second protrusion pattern on the second insulating layer at a center region of the pixel region.

The first protrusion pattern may expose a part of a drain electrode of the thin film transistor, and the pixel electrode may directly contact the drain electrode.

The pixel electrode may cover the second protrusion pattern.

The first protrusion pattern and the second protrusion pattern may be made of a single layer including an organic layer or an inorganic layer or may be made of a dual layer including the organic layer and the inorganic layer.

The liquid crystal display panel may further include: a common electrode facing the pixel electrode; and a liquid crystal layer interposed between the pixel electrode and the common electrode, wherein the liquid crystal layer includes reactive mesogen.

Another exemplary embodiment of the present invention provides a method of fabricating a liquid crystal display panel that includes: forming a sustain electrode in a pixel region on a first substrate; forming opaque wires extending in a first direction and a second direction crossing the first direction, the opaque wires having a lattice form to surround the pixel region on a same layer as the sustain electrode; forming a first insulating layer to cover the sustain electrode and the opaque wires and forming a gate wire extending in the first direction on the first insulating layer; forming a second insulating layer to cover the gate wire and forming a data wire extending in the second direction on the second insulating layer; forming a thin film transistor coupled with the gate wire and the data wire; and forming a pixel electrode coupled with the thin film transistor on the second insulating layer. In this embodiment, the sustain electrode includes a transparent conductive material, and the opaque wires include a conductive material having an electrical resistance lower than that of the transparent conductive material. The opaque wires may have a black color. The opaque wires may include molybdenum, and the sustain electrode may include ITO or IZO.

The method of fabricating a liquid crystal display panel further includes forming a first protrusion pattern to cover the thin film transistor and forming a second protrusion pattern on the second insulating layer at a center region of the pixel region.

The first protrusion pattern may expose a part of a drain electrode of the thin film transistor.

The first protrusion pattern and the second protrusion pattern may be formed by stacking a passivation layer including at least one of an organic layer or an inorganic layer to cover the thin film transistor and the second insulating layer, and the method further includes removing the passivation layer.

The first protrusion pattern and the second protrusion pattern may be made of a dual layer including the organic layer and the inorganic layer.

The method may further include: forming a common electrode on a second substrate and attaching the second substrate to the first substrate; and injecting liquid crystal molecules between the pixel electrode of the first substrate and the common electrode of the second substrate.

The liquid crystal molecules may include reactive mesogen.

According to the exemplary embodiments of the present invention, it is possible to improve an aperture ratio by reducing an attachment margin between an array substrate and a color filter substrate.

Further, it is possible to control liquid crystals in a VA mode through a protrusion pattern.

In addition, it is possible to implement a liquid crystal display having a high resolution by making the size of a pixel smaller.

DETAILED DESCRIPTION

Figure 1:
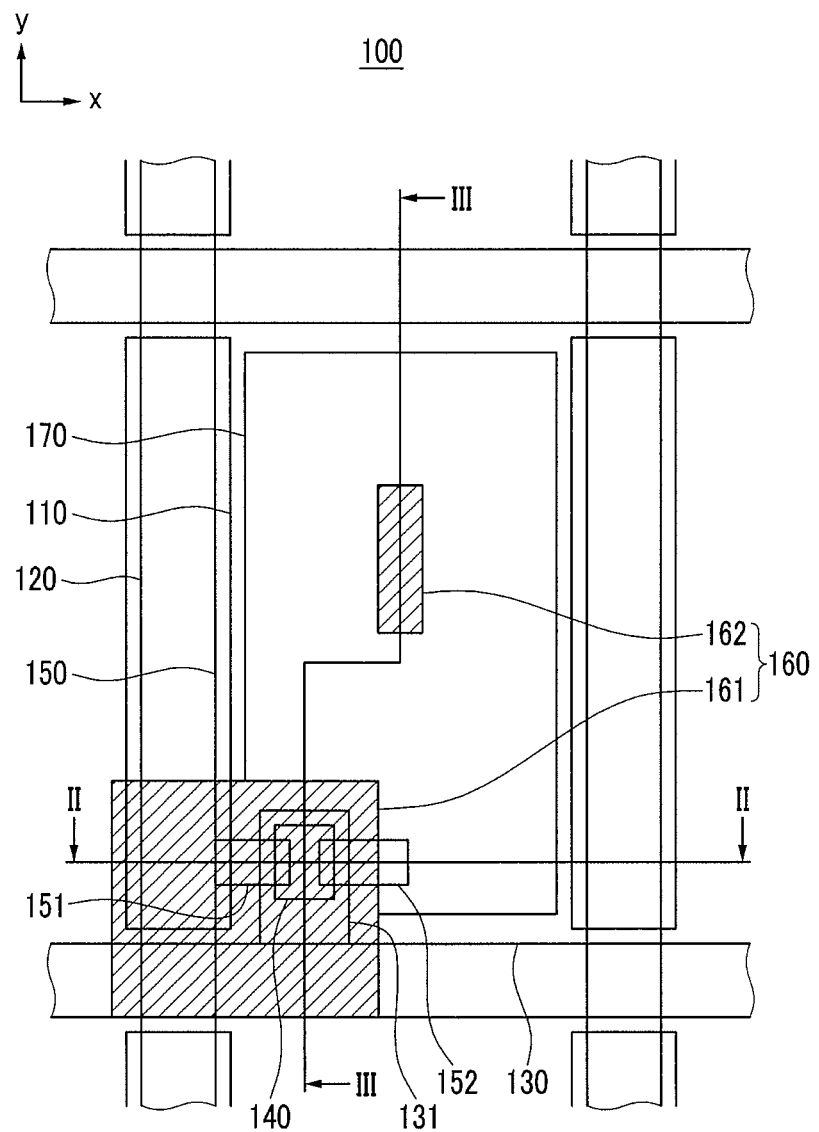
FIG. 1 is a plan layout view showing an array substrate of a liquid crystal display enlarging one pixel region according to an exemplary embodiment of the present invention.

The present invention will be described more fully hereinafter with reference to the accompanying drawings, in which exemplary embodiments of the invention are shown.

The drawings and description are to be regarded as illustrative in nature and not restrictive. Like reference numerals designate like elements throughout the specification. In addition, the size and thickness of each component shown in the drawings are exemplarily shown for understanding and ease of description, but the present invention is not limited thereto. In the drawings, the thicknesses of layers, films, panels, regions, etc., are exaggerated for clarity. It will be understood that when an element such as a layer, film, region, or substrate is referred to as being "on" another element, it can be directly on the other element, or intervening elements may also be present.

Figure 2:
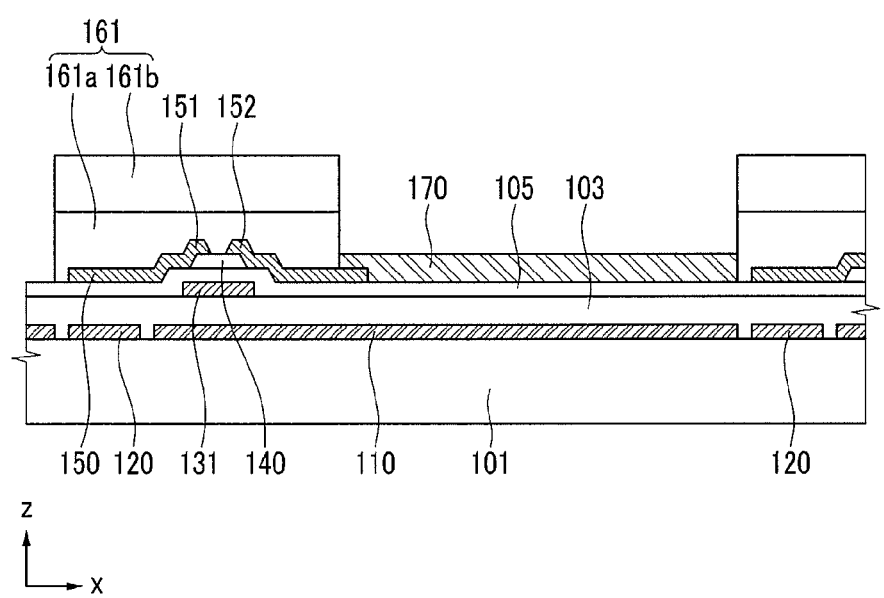
FIG. 2 is a cross-sectional view of the array substrate of the liquid crystal display panel taken along the line II-II of FIG. 1.
Figure 3:
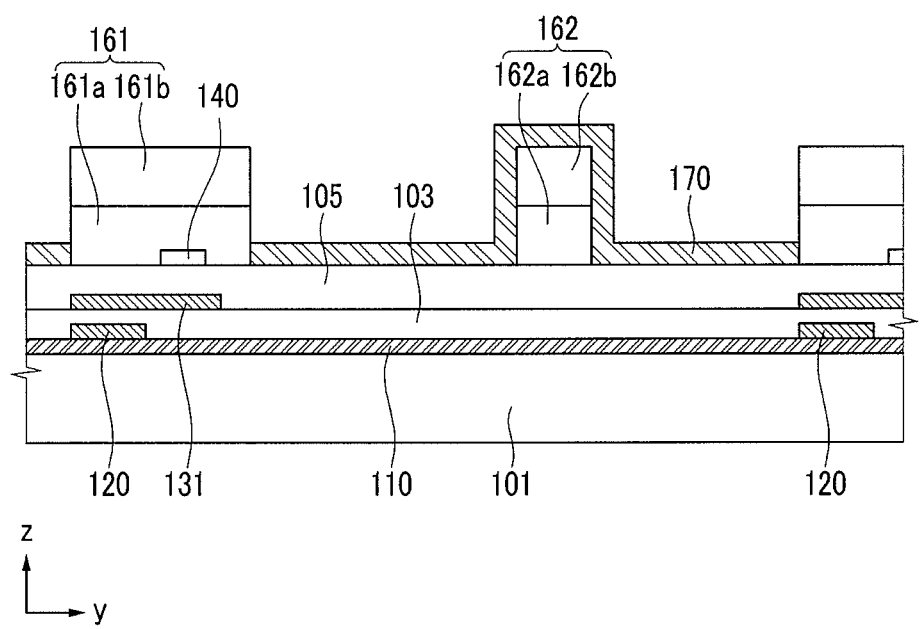
FIG. 3 is a cross-sectional view of the array substrate of the liquid crystal display panel taken along the line III-III of FIG. 1.

FIG. 1 is a plan layout view showing an array substrate of a liquid crystal display enlarging one pixel region according to an exemplary embodiment of the present invention, and FIGS. 2 and 3 are cross-sectional views of the array substrate of the liquid crystal display panel taken along lines II-II and III-III of FIG. 1. Hereinafter, the array substrate and the liquid crystal display panel including the same according to an exemplary embodiment of the present invention will be described with reference to the figures.

Referring to FIGS. 1 to 3, an array substrate 100 of the liquid crystal display panel according to an exemplary embodiment of the present invention includes a sustain voltage line including a sustain electrode 110 and opaque wires 120, a gate wire 130, a gate electrode 131 coupled with the gate wire 130, an active layer 140, a data wire 150, a source electrode 151 coupled with the data wire 150, a drain electrode 152 spaced apart from the source electrode 151, and a pixel electrode 170 contacting the drain electrode 152.

The liquid crystal display panel includes red (R), green (G), and blue (B) pixels for displaying an image, and in this specification, a region on the array substrate corresponding to a pixel is defined as a pixel region.

A sustain voltage line is formed on an insulating substrate 101. A sustain electrode 110 is formed to correspond to the pixel region, and the opaque wires 120 have a lattice form extending in a first direction and a second direction, which are orthogonal to each other and surround the periphery of each pixel region. The opaque wires 120 are made of an opaque low-resistance conductive material. The opaque wires 120 are coupled with the sustain electrode 110 to apply the sustain voltage to the sustain electrode 110 so as to transfer a signal. The sustain electrode 110 is made of a transparent conductive material. Since the transparent conductive material has electrical resistance comparatively higher than the opaque conductive material, signal delay due to high resistance may occur in the case of directly applying the sustain voltage by using the transparent conductive material as the wire.

In an exemplary embodiment, by directly contacting the opaque wires 120, including the opaque low-resistance conductive material instead of the transparent conductive material as the wire for applying the sustain voltage, with the sustain electrode 110 for applying a common voltage, signal delay which occurs due to high electric resistance can be prevented or reduced. In addition, the sustain electrode 110 forms a capacitor with a pixel electrode 170 to be described in more detail below. It is possible to increase the capacitance of the capacitor by forming the sustain electrode 110 widely in the pixel region. Further, in an exemplary embodiment, the sustain electrode 110 is formed to correspond to the pixel region, while the opaque wires 120 are formed at the periphery of the pixel region so as to prevent the aperture ratio from being reduced due to the opaque wires 120. As such, the opaque wires 120 formed along the periphery of the pixel region on the array substrate 100 may be made of metal and may have a black color to serve as a black matrix (BM). Therefore, an additional black matrix does not need to be formed on the color filter substrate facing the array substrate 100 in the liquid crystal display panel.

In an exemplary embodiment, the opaque wires 120 and the sustain electrode 110 include molybdenum and indium tin oxide (hereinafter, referred to as "ITO"), respectively, but the present invention is not limited thereto, and materials thereof may be variously modified by those skilled in the art.

The sustain voltage line including the sustain electrode 110 and the opaque wires 120 is covered with a first insulating layer 103, and the gate wire 130 is formed on the first insulating layer 103 corresponding to the sustain electrode 110 and the opaque wire 120. That is, the gate wire 130 is formed below the pixel region and extends in a first direction (x-axis direction) with reference to FIG. 1. A gate electrode 131 which protrudes toward the pixel region is coupled to the gate wire 130, and a gate signal is transferred through the gate wire 130.

A second insulating layer 105 is formed on the gate wire 130 and the gate electrode 131. An active layer 140 is formed on the second insulating layer 105 corresponding to the gate electrode 131. In an exemplary embodiment, the active layer 140 is made of polysilicon, but the present invention is not limited thereto.

The data wire 150 is formed on the second insulating layer 105 corresponding to the opaque wires 120.

The data wire 150 is formed at the left side of the pixel region and extends in a second direction (y-axis direction) to cross the gate wire 130 with reference to FIG. 1. The source electrode 151 which protrudes toward the pixel region is coupled to the data wire 150, and the data signal is transferred through the data wire 150. The drain electrode 152 is spaced apart from the source electrode 151. Referring to FIG. 2, the source electrode 151 and the drain electrode 152 are formed on the active layer 140, and form a thin film transistor (TFT) together with the gate electrode 131 and the active layer 140.

Here, the data wire 150 is not overlapped with the sustain electrode 110 unlike the gate wire 130 so as to prevent an unnecessary capacitor from being formed between the sustain electrode 110 and the data wire 150. Minute voltage is consistently changing in the data wire 150 while transferring the data signal unlike the gate wire 130. As a result, when a capacitor is formed between the data wire 150 and the sustain electrode 110, entire impedance increases so as to delay the transferring of the data signal. Therefore, in an exemplary embodiment, the data wire 150 and the sustain electrode 110 are not overlapped with each other, thereby preventing the data signal from being delayed.

The array substrate 100 according to an exemplary embodiment further includes protrusion patterns 160. The protrusion patterns 160 include a first protrusion pattern 161 formed on the thin film transistor and a second protrusion pattern 162 formed at the center region of the pixel region. The pixel electrode 170 is formed on the second insulating layer 105 and the second protrusion pattern 162 in the pixel region.

Referring to FIG. 2, the first protrusion pattern 161 is formed to cover the entirety of the source electrode 151 and the active layer 140 and a part of the drain electrode 152, which is exposed to directly contact the pixel electrode 170.

As such, the first protrusion pattern 161 is formed on the thin film transistor to serve as a passivation layer protecting the active layer 140, and the like. Further, referring to FIG. 3, the second protrusion pattern 162 is formed on the second insulating layer 105 at the center region of the pixel region. The liquid crystal layer is controlled through the second protrusion pattern 162, and it will be described in more detail below. In an exemplary embodiment, the first protrusion pattern 161 and the second protrusion pattern 162 are formed in a dual-layer structure of inorganic layers 161a and 162a and organic layers 161b and 162b, but the present invention is not limited thereto. The first protrusion pattern 161 and the second protrusion pattern 162 may be formed in a single-layer structure of the inorganic layer or the organic layer.

In general, a pixel electrode is formed in a structure in which a via hole is formed on a passivation layer covering the entirety of a thin film transistor, and the pixel electrode is coupled with a drain electrode of the thin film transistor through the via hole. In such a structure, in the case in which the size of the pixel decreases in order to implement a high resolution display, a region occupied by the via hole comparatively increases, as a result, the aperture ratio is deteriorated. Furthermore, if the via hole is larger than the desired pixel, the pixel itself may not be formed.

However, in an exemplary embodiment, since the protrusion pattern 160 is formed on the thin film transistor and at only the center region of the pixel region without forming the via hole on the passivation layer, the problem of small sized via hole can be solved. Further, since the passivation layer is not formed throughout the pixel region, it is possible to prevent the aperture ratio from being deteriorated by the passivation layer. Further, the drain electrode 152 of the thin film transistor may directly contact the pixel electrode 170 to apply an electric field for driving the liquid crystal layer.

As described in reference to the above exemplary embodiment, the opaque wires 120 are formed in the lattice form on the periphery of the pixel region on the array substrate 100 of the liquid crystal display panel so as to prevent a signal of the sustain voltage from being delayed. Also the opaque wires 120 serve as a black matrix, such that an additional black matrix does not need to be formed on the color filter substrate. As a result, the attachment margin between the array substrate 100 and the color filter substrate can be reduced to thereby improve the aperture ratio.

Further, the protrusion pattern 160 is formed on the thin film transistor and at the center region of the pixel region instead of the passivation layer formed throughout the pixel region on the array substrate 100 of the liquid crystal display panel, such that the size of a pixel may be small. As a result, it is possible to implement the high resolution.

Figure 4A:
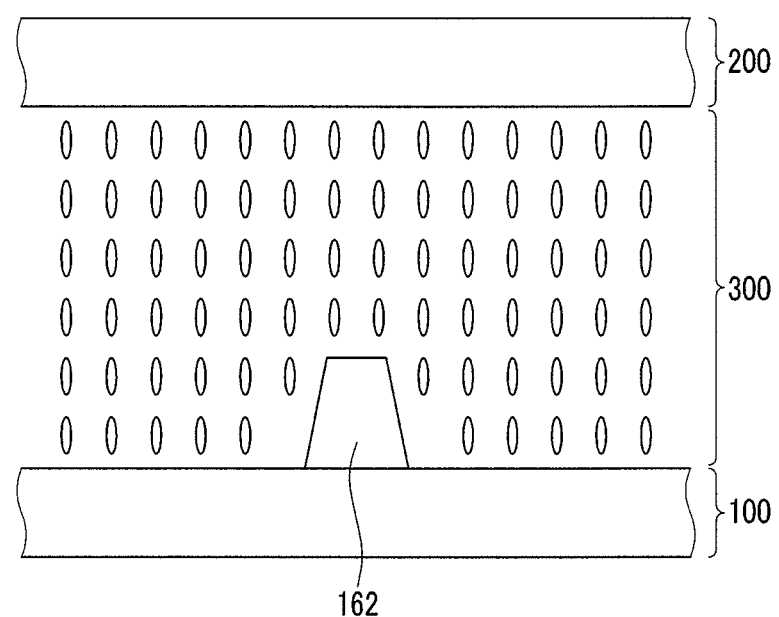
FIGS. 4A and 4B are schematic cross-sectional views of a liquid crystal display panel before and after applying an electric field to a liquid crystal layer according to an exemplary embodiment of the present invention.
Figure 4B:
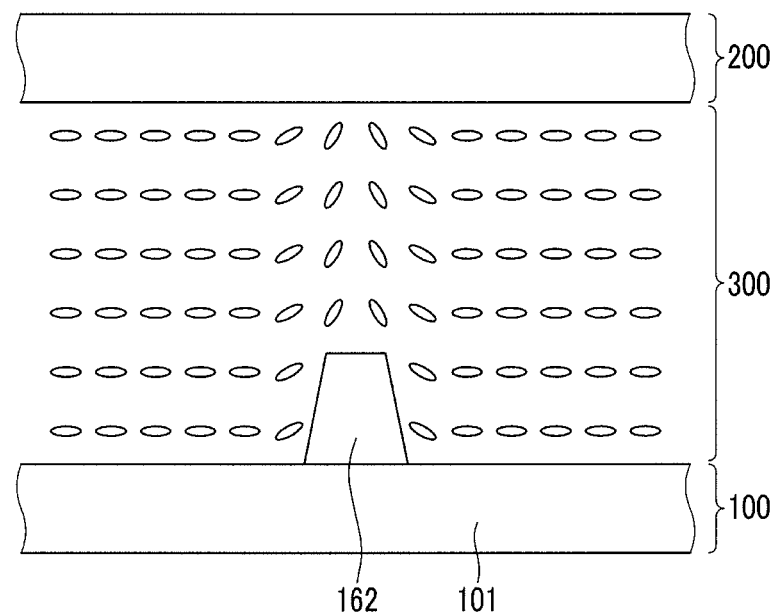

FIGS. 4A and 4B are schematic cross-sectional views of a liquid crystal display panel before and after applying an electric field to a liquid crystal layer according to an exemplary embodiment of the present invention. Hereinafter, a method for driving the liquid crystal layer to display an image according to an exemplary embodiment of the present invention will be described in detail with reference to FIGS. 4A and 4B.

Referring to FIGS. 4A and 4B, the liquid crystal display panel according to an exemplary embodiment of the present invention includes an array substrate 100, a color filter substrate 200 facing the array substrate 100, and a liquid crystal layer 300 interposed between the array substrate 100 and the color filter substrate 200. As described above, thin film transistors are formed on the array substrate 100, and a second protrusion pattern 162 is formed at the center region of the pixel region. A color filter and a common electrode are formed on the color filter substrate 200.

The liquid crystal layer 300, before applying the electric field between the array substrate 100 and the color filter substrate 200, is in a vertical alignment (VA) mode in which liquid crystal molecules are vertically aligned between the array substrate 100 and the color filter substrate 200 as shown in FIG. 4A. When the electric field is applied to the liquid crystal layer 300 by applying voltage to the pixel electrode of the array substrate 100, a singular point is formed around the second protrusion pattern 162, and liquid crystal molecules are horizontally aligned centering on the singular point as shown in FIG. 4B. As such, in the exemplary embodiment of FIGS. 4A and 4B, the second protrusion pattern 162 is formed on the array substrate 100 to thereby control the liquid crystal molecules.

Here, in order to more effectively control the liquid crystal molecules, the liquid crystal molecules include reactive mesogen in an exemplary embodiment. Specifically, when the liquid crystal molecules including the reactive mesogen are exposed to ultraviolet rays without applying the electric field, the reactive mesogen is attached to the electrode with a small protrusion form to allow the liquid crystal molecules to maintain a vertical state.

As described above, the second protrusion pattern 162 is formed on the array substrate 100, such that the singular point is formed around the second protrusion pattern 162 to control the liquid crystals. And, the reactive mesogen is included in the liquid crystal molecules so as to align the liquid crystal molecules in the VA mode.

FIGS. 5A to 5G are diagrams illustrating a method of fabricating an array substrate of a liquid crystal display panel focusing on a pixel region according to an exemplary embodiment of the present invention. Hereinafter, the method of fabricating the liquid crystal display panel and the array substrate according to the exemplary embodiment of the present invention will be described.

Figure 5A:
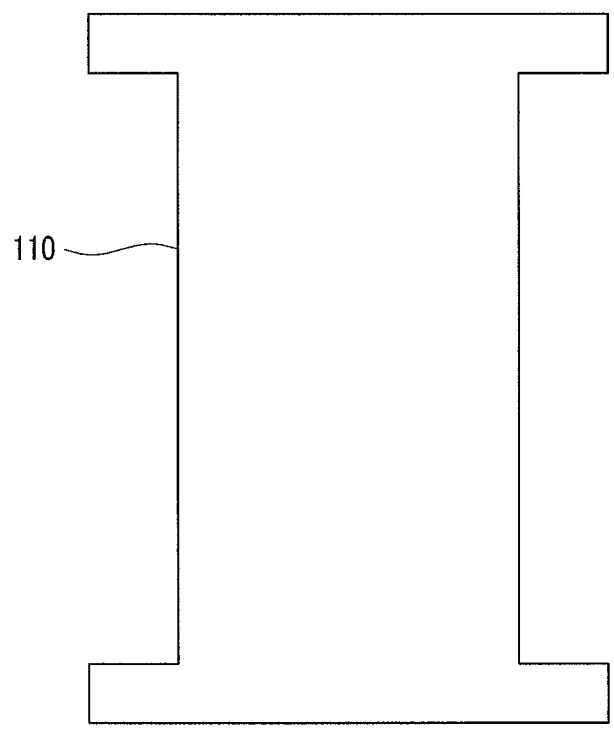
FIGS. 5A, 5B, 5C, 5D, 5E, 5F, and 5G are diagrams illustrating a method of fabricating an array substrate of a liquid crystal display panel focusing on a pixel region according to an exemplary embodiment of the present invention.

Referring to FIG. 5A, first, the sustain electrode 110 is formed on the insulating substrate. As described above, in order to prevent an unnecessary capacitor from being formed between the data wire 150 and the sustain electrode 110, the sustain electrode 110 is formed in an "I" shape in a pixel region. Further, in an exemplary embodiment, the sustain electrode 110 includes ITO. However, the shape and material of the sustain electrode 110 may be variously modified by those skilled in the art. In an embodiment, the sustain electrode 110 may be formed to cover the entirety of the pixel region and may be made of a transparent conductive material such as indium zinc oxide (hereinafter, referred to as "IZO"). Here, FIG. 5A shows one pixel region, and the sustain electrode 110 is coupled with another adjacent pixel region.

Figure 5B:
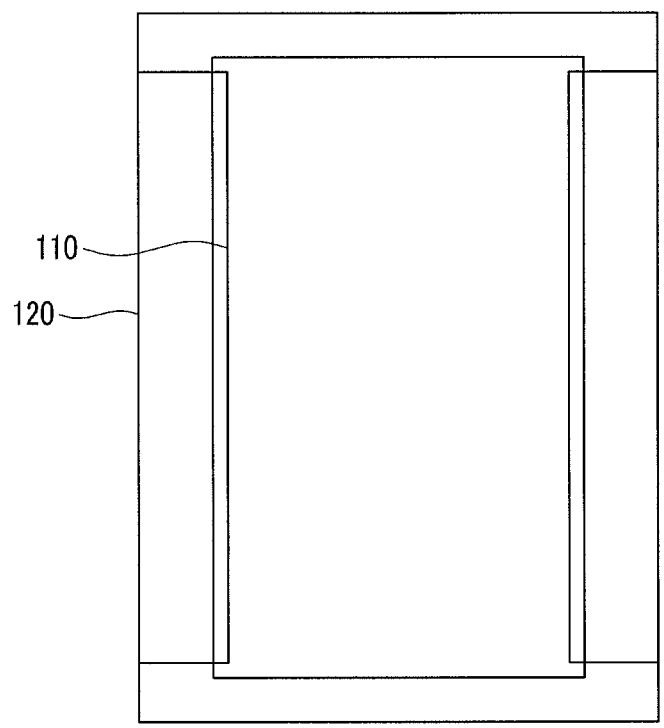

Referring to FIG. 5B, after the sustain electrode 110 is formed, the opaque wires 120 are formed along the periphery of the pixel region. The opaque wires 120 are formed on the periphery of the pixel region on the basis of one pixel, but the opaque wires 120 are formed in the lattice form throughout the array substrate to apply the sustain voltage to the sustain electrode 110. Specifically, referring to FIG. 5B, the sustain voltage is applied at the upper and lower parts of the opaque wires 120 in contact with the sustain electrode 110, and the opaque wires 120 are made of a material having comparatively low electric resistance to suppress or reduce the signal delay. In an embodiment, the opaque wires 120 include molybdenum, but as described above, the opaque wires 120 may include various suitable opaque low-resistance conductive materials in addition to molybdenum. As described above, the opaque wires 120 may be formed by a metallic electrode and may have a black color to serve as the black matrix, such that by such a configuration, the additional black matrix does not need to be formed on the color filter substrate of the liquid crystal display panel.

Figure 5C:
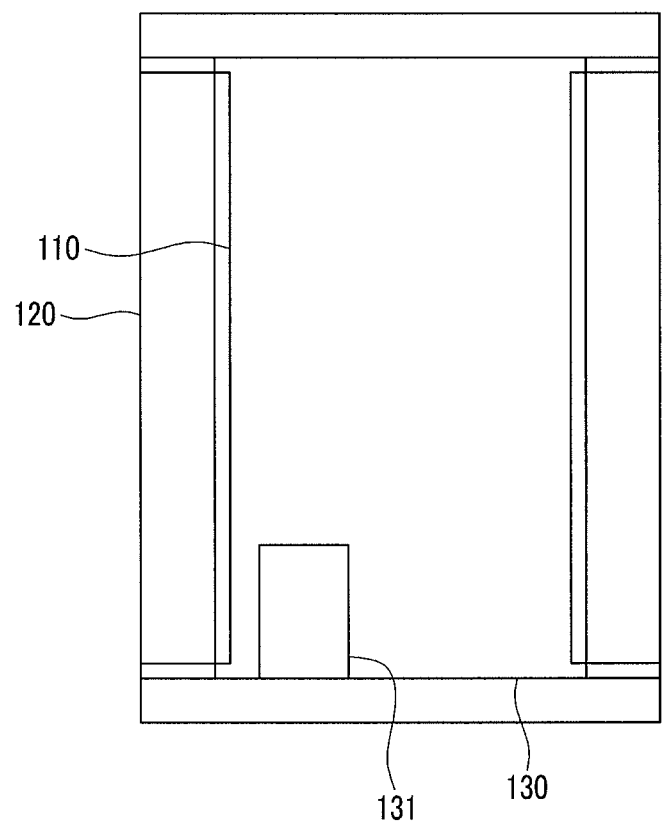
Figure 5D:
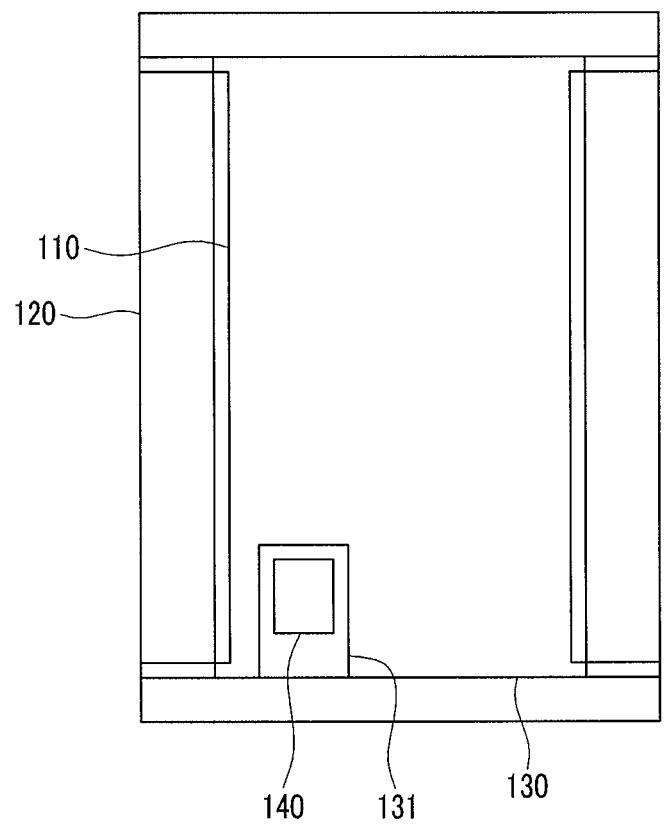

Referring to FIG. 5C, after the first insulating layer is formed on the sustain electrode 110 and the opaque wires 120, the gate wire 130 and the gate electrode 131, which is coupled with the gate wire 130 and protrudes to the pixel region, are formed to correspond to the upper and lower opaque wires 120. Thereafter, the second insulating layer is formed on the gate wire 130 and the gate electrode 131, and as shown in FIG. 5D, the active layer 140 is formed at a position corresponding to the gate electrode 131. In an exemplary embodiment, the active layer 140 is made of polysilicon, but the present invention is not limited thereto.

Figure 5E:
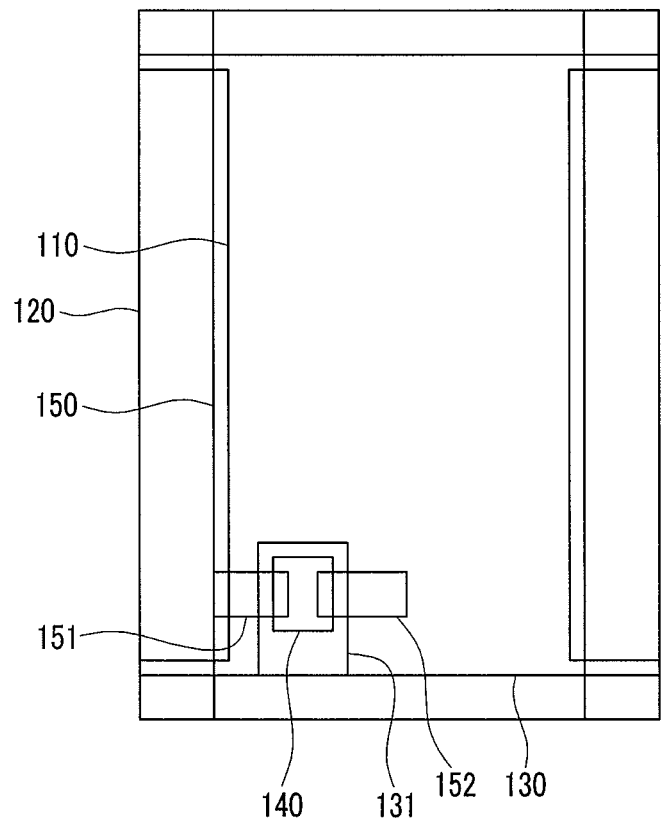

Referring to FIG. 5E, the data wire 150 is formed to correspond to the left and right opaque wires 120, and in addition, the source electrode 151 is coupled with the data wire 150 and extends to one portion of the active layer 140, and the drain electrode 152 is spaced apart from the source electrode 151 and extends to the other portion of the active layer 140. The gate electrode 131, the active layer 140, the source electrode 151, and the drain electrode 152 form the thin film transistor to apply driving voltage to the pixel electrode 170.

Figure 5F:
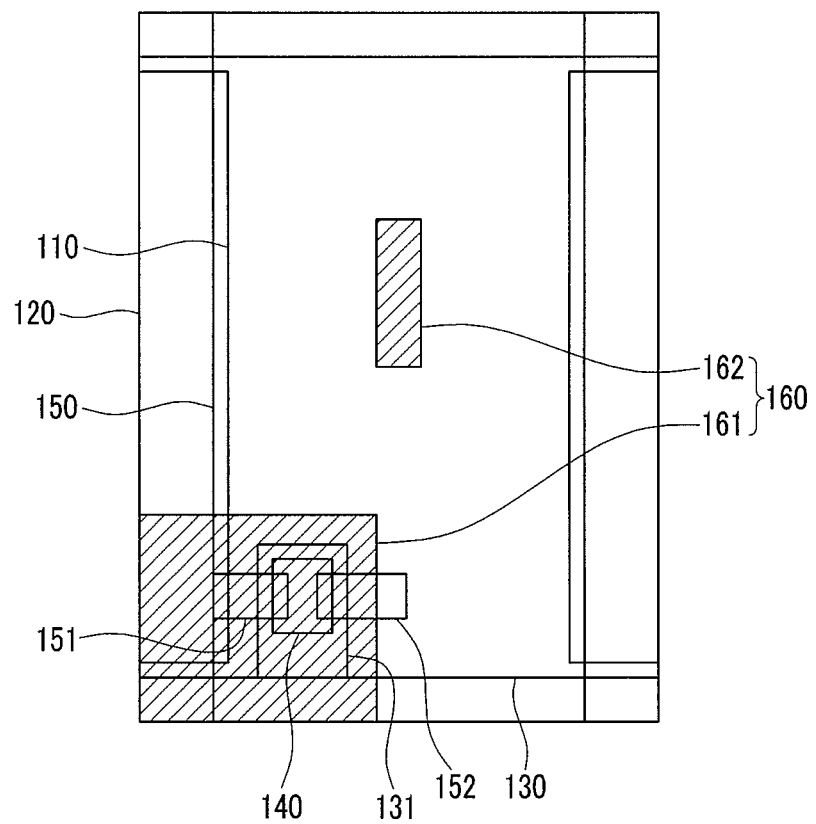

Referring to FIG. 5F, the protrusion patterns 160 including the first protrusion pattern 161 and the second protrusion pattern 162 are formed on the thin film transistor and at the center region of the pixel region, respectively. In an exemplary embodiment, the protrusion patterns 160 are formed by a method of leaving and removing only the protrusion patterns 160 after stacking the passivation layer in a dual layer structure of the inorganic layer and the organic layer in the entirety of the pixel region. That is, the passivation layer is gradually removed at both sides of the upper part and lower part or the left part and the right part of the pixel region, and the removal process is repeated until a desired pattern is left on the thin film transistor and at the center region of the pixel region. In this case, when the first protrusion pattern 161 is formed, the drain electrode 152 is partially exposed to directly contact the pixel electrode 170. Here, the passivation layer for forming the protrusion patterns 160 may be stacked in the single layer structure of the inorganic layer or the organic layer.

Figure 5G:
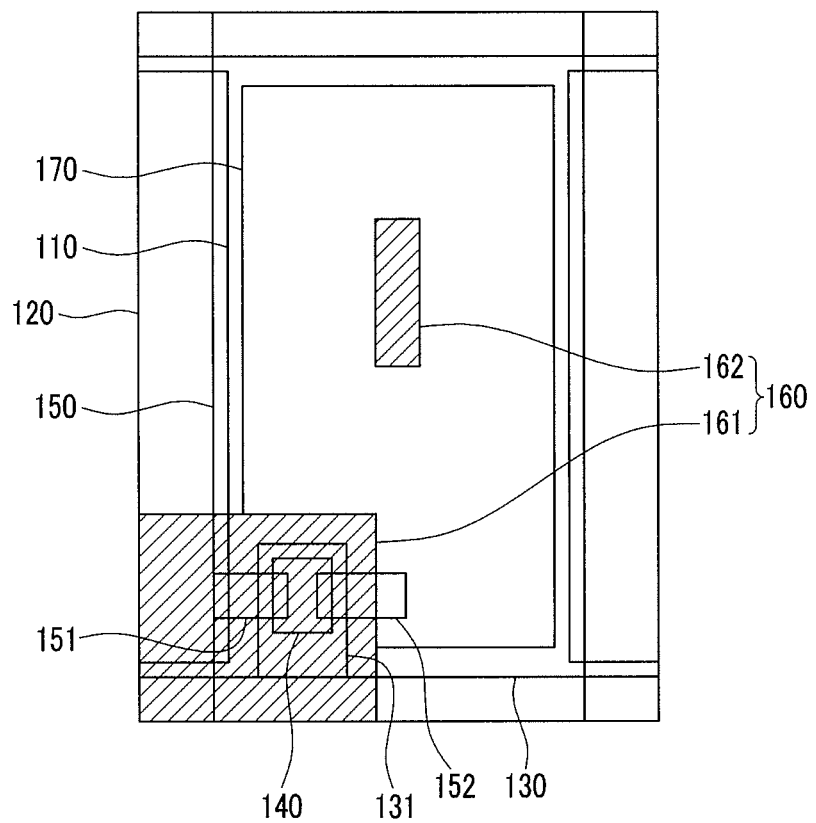

Referring to FIG. 5G, the pixel electrode 170 is formed on the second insulating layer and the second protrusion pattern 162. As described above, the pixel electrode 170 directly contacts the drain electrode 152 to be applied with the driving voltage. In an exemplary embodiment, the pixel electrode 170 includes ITO, but the material of the pixel electrode 170 is not limited thereto and may be made of various suitable transparent conductive materials such as indium zinc oxide, and the like.

Through such a process, it is possible to fabricate the array substrate including the opaque wires 120 serving as the black matrix and the second protrusion pattern 162 for controlling the liquid crystal molecules.

The color filter substrate including the color filter and the common electrode which faces the array substrate fabricated as described above is attached to the array substrate, and the liquid crystal layer is injected between the array substrate and the color filter substrate, thereby fabricating the liquid crystal display panel. In an exemplary embodiment, the reactive mesogen is included in the liquid crystal molecules so as to effectively control the liquid crystal molecules in the VA mode.

As described above, the opaque wires 120 serving as the black matrix are formed on the array substrate, and thus, an additional black matrix does not need to be formed on the color filter substrate. As a result, the attachment margin between the array substrate and the color filter substrate can be reduced, thereby improving the aperture ratio. Further, it is possible to ensure the aperture ratio while suppressing the signal delay by forming the opaque wires 120 around the pixel region. Further, it is possible to control the liquid crystal molecules by forming the second protrusion pattern 162 at the center region of the pixel region.

While the present invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims and their equivalents.

DESCRIPTION OF SYMBOLS

| | |
|---|---|
| 100: | Array substrate |
| 101: | Insulating substrate |
| 103: | First insulating layer |
| 105: | Second insulating layer |
| 110: | Sustain electrode |
| 120: | Opaque wire |
| 130: | Gate wire |
| 131: | Gate electrode |
| 140: | Active layer |
| 150: | Data wire |
| 151: | Source electrode |

-continued

| | |
|---|---|
| 152: | Drain electrode |
| 160: | Protrusion pattern |
| 161: | First protrusion pattern |
| 162: | Second protrusion pattern |
| 170: | Pixel electrode |
| 200: | Color filter substrate |
| 300: | Liquid crystal layer |

What is claimed is:

1. A liquid crystal display panel comprising:
a substrate;
a sustain electrode at a pixel region on the substrate;
opaque wires around the pixel region, having a lattice form extending in a first direction and a second direction crossing the first direction, and being coupled with the sustain electrode;
a gate wire insulated from the sustain electrode and the opaque wires with a first insulating layer interposed therebetween and extending in the first direction;
a data wire insulated from the gate wire with a second insulating layer interposed therebetween and extending in the second direction;
a thin film transistor coupled with the gate wire and the data wire; and
a pixel electrode coupled with the thin film transistor,
wherein the sustain electrode comprises a transparent conductive material, and the opaque wires comprise a conductive material having an electrical resistance lower than that of the transparent conductive material.

2. The liquid crystal display panel of claim 1, wherein the opaque wires have a black color.

3. The liquid crystal display panel of claim 1, wherein the opaque wires comprise molybdenum.

4. The liquid crystal display panel of claim 1, wherein the sustain electrode comprises indium tin oxide (ITO) or indium zinc oxide (IZO).

5. The liquid crystal display panel of claim 1, wherein at least a part of the sustain electrode and the data wire are not overlapped with each other.

6. The liquid crystal display panel of claim 1, further comprising:
a first protrusion pattern covering the thin film transistor; and
a second protrusion pattern on the second insulating layer at a center region of the pixel region.

7. The liquid crystal display panel of claim 6, wherein the first protrusion pattern exposes a part of a drain electrode of the thin film transistor, and the pixel electrode directly contacts the drain electrode.

8. The liquid crystal display panel of claim 6, wherein the pixel electrode covers the second protrusion pattern.

9. The liquid crystal display panel of claim 8, further comprising:
a common electrode facing the pixel electrode; and
a liquid crystal layer between the pixel electrode and the common electrode,
wherein the liquid crystal layer comprises reactive mesogen.

10. The liquid crystal display panel of claim 6, wherein the first protrusion pattern and the second protrusion pattern are made of a single layer comprising an organic layer or an inorganic layer.

11. The liquid crystal display panel of claim 6, wherein the first protrusion pattern and the second protrusion pattern are made of a dual layer comprising an organic layer and an inorganic layer.

12. A method of fabricating a liquid crystal display panel, the method comprising:
forming a sustain electrode in a pixel region on a first substrate;
forming opaque wires extending in a first direction and a second direction crossing the first direction, the opaque wires having a lattice form to surround the pixel region on a same layer as the sustain electrode;
forming a first insulating layer to cover the sustain electrode and the opaque wires and forming a gate wire extending in the first direction on the first insulating layer;
forming a second insulating layer to cover the gate wire and forming a data wire extending in the second direction on the second insulating layer;
forming a thin film transistor coupled with the gate wire and the data wire; and
forming a pixel electrode coupled with the thin film transistor on the second insulating layer,
wherein the sustain electrode comprises a transparent conductive material and the opaque wires comprise an opaque conductive material having an electrical resistance lower than that of the transparent conductive material.

13. The method of claim 12, wherein the opaque wires have a black color.

14. The method of claim 12, wherein the opaque wires comprise molybdenum.

15. The method of claim 12, wherein the sustain electrode comprises ITO or IZO.

16. The method of claim 12, further comprising:
before the forming of the pixel electrode, forming a first protrusion pattern to cover the thin film transistor and forming a second protrusion pattern on the second insulating layer at a center region of the pixel region.

17. The method of claim 16, wherein the first protrusion pattern exposes a part of a drain electrode of the thin film transistor.

18. The method of claim 17, wherein the first protrusion pattern and the second protrusion pattern are formed by stacking a passivation layer comprising at least one of an organic layer or an inorganic layer to cover the thin film transistor and the second insulating layer, and
the method further comprises removing the passivation layer.

19. The method of claim 18, wherein the first protrusion pattern and the second protrusion pattern are made of a dual layer comprising the organic layer and the inorganic layer.

20. The method of claim 16, further comprising:
forming a common electrode on a second substrate and attaching the second substrate to the first substrate; and
injecting liquid crystal molecules between the pixel electrode of the first substrate and the common electrode of the second substrate.

21. The method of claim 20, wherein the liquid crystal molecules comprise reactive mesogen.

* * * * *